(12) United States Patent
Schwarzl et al.

(10) Patent No.: US 7,407,729 B2
(45) Date of Patent: Aug. 5, 2008

(54) EUV MAGNETIC CONTRAST LITHOGRAPHY MASK AND MANUFACTURE THEREOF

(75) Inventors: Siegfried Schwarzl, Neubiberg (DE); Stefan Wurm, Austin, TX (US)

(73) Assignee: Infineon Technologies AG, Munich (DE)

( * ) Notice: Subject to any disclaimer, the term of this patent is extended or adjusted under 35 U.S.C. 154(b) by 733 days.

(21) Appl. No.: 10/912,658

(22) Filed: Aug. 5, 2004

(65) Prior Publication Data
US 2006/0029866 A1    Feb. 9, 2006

(51) Int. Cl.
*G03F 1/00* (2006.01)
(52) U.S. Cl. .......................................................... 430/5
(58) Field of Classification Search ...................... 430/5, 430/30; 378/35
See application file for complete search history.

(56) References Cited

U.S. PATENT DOCUMENTS

| | | | |
|---|---|---|---|
| 6,002,740 A | 12/1999 | Cerrina et al. | |
| 6,023,328 A | 2/2000 | Pierrat | |
| 6,352,803 B1 | 3/2002 | Tong et al. | |
| 6,562,525 B2 | 5/2003 | Mori | |
| 6,583,068 B2 | 6/2003 | Yan et al. | |
| 6,627,362 B2 | 9/2003 | Stivers et al. | |
| 6,720,118 B2 | 4/2004 | Yan et al. | |
| 6,738,135 B1 | 5/2004 | Underwood et al. | |
| 6,998,200 B2 * | 2/2006 | Lee | 430/5 |
| 2003/0000921 A1 | 1/2003 | Liang et al. | |
| 2003/0198874 A1 | 10/2003 | Lee | |
| 2005/0208389 A1 * | 9/2005 | Ishibashi et al. | 430/5 |

OTHER PUBLICATIONS

Ko, Yeong-Uk, et al., "Simulation of Imaging in Projection Microscope Using Multi-Beam Probes," SPEI (2002) 11 pages.
Seiler, Helmut, "Abbildung Von Oberflachen," Bibliographisches Institut, Manheim/Zurich (1968) pp. 96-100.

* cited by examiner

*Primary Examiner*—Stephen Rosasco
(74) *Attorney, Agent, or Firm*—Slater & Matsil, L.L.P.

(57) ABSTRACT

An EUV Lithography mask, a fabrication method, and use method thereof is provided. A preferred embodiment comprises a substrate, a Bragg reflector disposed upon the substrate, a buffer disposed upon the Bragg reflector, and an absorber layer disposed upon the buffer. The materials in the mask have selected magnetic properties. In a preferred embodiment, the buffer is a hard magnetic material, and the absorber is a soft magnetic material. Another preferred embodiment includes a mask manufacturing method further including a mask step. In a preferred embodiment, an electron mirror microscope is used to inspect the mask by imaging its topography with respect to its magnetic properties in an applied magnetic field.

26 Claims, 4 Drawing Sheets

EUV MAGNETIC CONTRAST LITHOGRAPHY MASK AND MANUFACTURE THEREOF

TECHNICAL FIELD

The present invention relates generally to semiconductor fabrication, and more particularly to EUV lithography.

BACKGROUND

Lithography uses an imaging system that directs radiation onto a mask to form a pattern. It projects the image of that pattern onto a semiconductor wafer covered with light-sensitive photoresist. The pattern is formed from absorptive features or lines etched into the mask. The radiation used in lithography may be at any suitable wavelength, with the resolution of the system increasing with decreasing wavelength. The ability to print smaller features onto the semiconductor wafer improves as the resolution increases.

Ongoing improvements in lithography have allowed the shrinkage of semiconductor integrated circuits (ICs) to produce devices with higher density and better performance. One highly promising lithography system uses radiation in the extreme ultraviolet (EUV) wavelength range. Generally, EUV radiation has wavelengths in the range of about 1 to 40 nanometers (nm), and the EUV radiation used in lithography has wavelengths in the range of about 10 to 15 nm. Lithography carried out with radiation in this region has come to be known as EUV lithography (EUVL).

EUV radiation is strongly absorbed in virtually all materials, even gases. Absorption, therefore, rules out the use of refractive optical elements, such as lenses and transmission masks. Therefore, EUVL imaging systems are entirely reflective. In order to achieve reasonable reflectivities near normal incidence, surfaces must be coated with multilayer, thin-film coatings known as distributed Bragg reflectors. Reflective masks are usually tuned to reflect EUV light in the 10-15 nm range (bright field area). Reflective masks typically further include a patterned absorber deposited on top of the Bragg reflector that absorbs suitable wavelengths of the incident EUV light (dark field area). The height of the patterned absorber is comparable to the lateral feature sizes to be imaged onto the wafers.

EUV masks have to be free of defects and particles since those would inevitably be imaged onto the wafer well, and will, in most cases, drastically reduce the number of functioning chips per wafer. Since the features on the semiconductor chips produced by the EUVL process are in the order of a fraction of a micrometer, any particles or imperfections on the mask on the active area of the pattern can be transferred to the pattern circuit. Mask defects will cause the circuit to be improperly written and, thus, malfunction. Consequently, it is necessary to inspect the EUVL mask to ensure that no defects have been created in the pattern area by this process.

Figures 1, 2A, 2B, 2C:
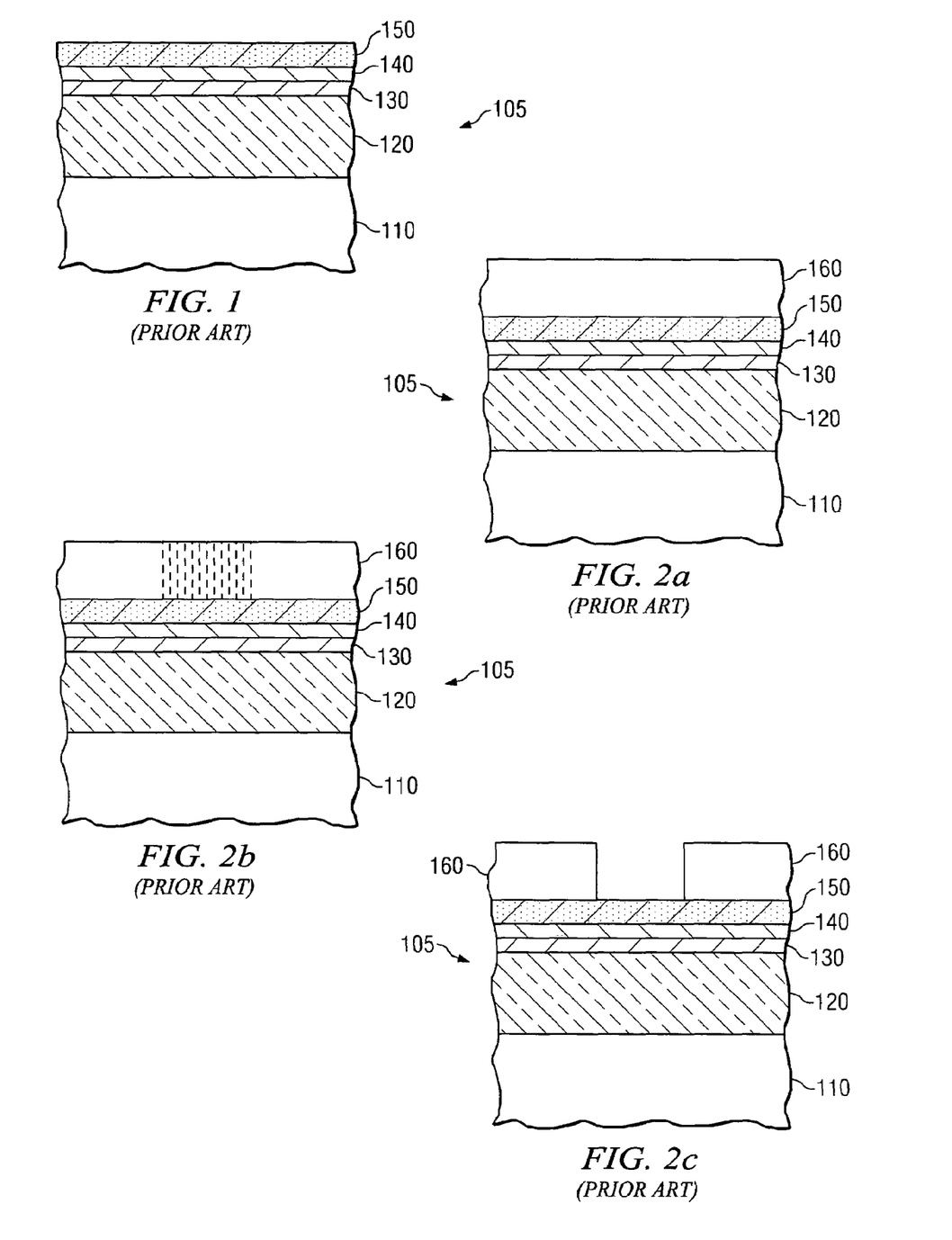
FIG. 1 is a typical EUV mask made according to SEMI P37-1102 and SEMI P38-1103 EUV specifications.
FIG. 2a is a cross-sectional illustration of the resist coating step in a typical EUV mask manufacturing process.
FIG. 2b is a cross-sectional illustration of the resist exposure step in a typical EUV mask manufacturing process.
FIG. 2c is a cross-sectional illustration of the resist development step in a typical EUV mask manufacturing process.

FIG. 1 shows a typical EUV mask blank manufactured according to the SEMI P37-1102 and SEMI P38 1103 EUV mask substrate and EUV mask blank specifications published in 2002 by the Semiconductor Equipment and Materials International of San Jose, Calif. The mask 105 comprises an EUV mask substrate 110, an EUV Bragg reflector 120, an optional protective layer commonly called a capping layer 130, a protective buffer layer 140 to prevent damage during absorber patterning and mask repair, and an EUV absorber layer 150. Various embodiments of an EUV mask according to the prior art will be described next.

As shown in FIG. 1, a substrate 110 with a low defect level and a smooth surface is used as the starting material for an EUV mask. The substrate 110 generally a glass or glass-ceramic material that has a low coefficient of thermal expansion (CTE). However, in some cases, the substrate 110 may be Silicon. Although Silicon has a large CTE that may result in undesirable displacement of printed images, Silicon also has a high thermal conductivity and thus may be a viable substrate as long as heat can be removed efficiently from the mask during exposure.

As further shown in FIG. 1, a multilayer (ML) mirror, or Bragg reflector, 120 covers the substrate 110. The Bragg reflector 120 includes about 20-80 pairs of alternating layers of a high atomic number, high Z, material and a low Z material. The high Z material may be about 2.8 nm thick Molybdenum (Mo) while the low Z material may be about 4.1 nm thick Silicon (Si).

An optional capping layer 130, such as about 11.0 nm thick Silicon (Si), may cover the top of the Bragg reflector 120 to prevent oxidation of Molybdenum in the environment. The Bragg reflector 120 can achieve about 60-75% reflectivity at an illumination wavelength of about 13.4 nm.

Referring again to FIG. 1, a buffer layer 140 covers the upper surface of the Bragg reflector 120. The buffer layer 140 may have a thickness of about 20-105 nm. It may include Silicon Dioxide ($SiO_2$), such as low temperature oxide (LTO). Other materials, such as Silicon Oxynitride ($SiO_xN_y$) or Carbon (C) may also be used for the buffer layer 140.

As shown in FIG. 1, an absorber layer 150 covers the buffer layer 140. The absorber layer 150 may include about 45-215 nm of a material that will attenuate EUV light, remain stable during exposure to EUV light, and be compatible with the mask fabrication process.

Various metals, alloys, and ceramics may comprise the absorber layer 150. Ceramics are compounds formed from metals and nonmetals. Examples of metals include Aluminum (Al), Aluminum-Copper (AlCu), Chromium (Cr), Nickel (Ni), Tantalum (Ta), Titanium (Ti), and Tungsten (W). In some cases, the absorber layer 150 may be partially or entirely formed out of borides, carbides, nitrides, oxides, phosphides, suicides, or sulfides of certain metals. Examples include Nickel Silicide (NiSi), Tantalum Boride (TaB), Tantalum Germanium (TaGe), Tantalum Nitride (TaN), Tantalum Silicide (TaSi), Tantalum Silicon Nitride (TaSiN), and Titanium Nitride (TiN).

FIGS. 2a-2h show the sequence of major process steps during mask manufacturing. The initial steps comprise coating FIG. 2a the mask with resist 160, exposing FIG. 2b the resist 160, and developing FIG. 2c the pattern (not shown). In the step illustrated in FIG. 2d, the pattern is transferred from the resist to the absorber using an absorber etch. In the absorber etch step, FIG. 2d, it is preferable that the absorber and buffer have high etch selectivity. In the next step, FIG. 2e, the mask is inspected for defects after absorber etch and resist removal.

In order to locate defects, such as absorber residue in a bright field area, current technology requires high optical contrast between the absorber and buffer layers. Since both absorber and buffer are very thin layers, choosing the right layer thickness for optimal inspection contrast is as important as choosing the right layer materials.

Referring again to FIGS. 2a-2h, a mask repair step, FIG. 2f, follows inspection, FIG. 2e. One repair method, a Focused Ion Beam (FIB) can evaporate unwanted absorber from a bright field area. A focused ion beam can also cause local deposition from an absorber-bearing gas at a clear spot defect (dark field repair).

Figure 2D:
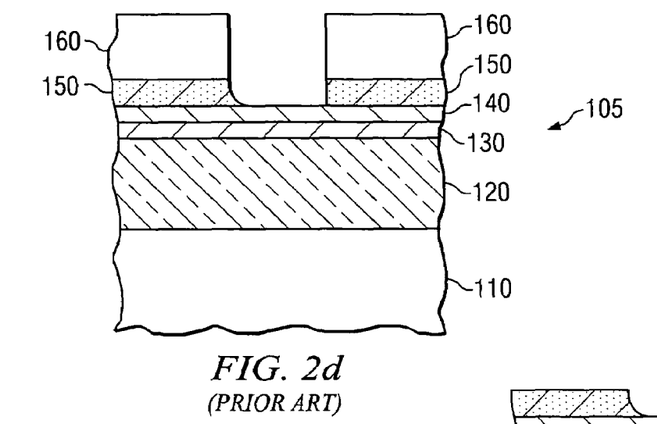
FIG. 2d is a cross-sectional illustration of the absorber etch step in a typical EUV mask manufacturing process.
Figure 2E:
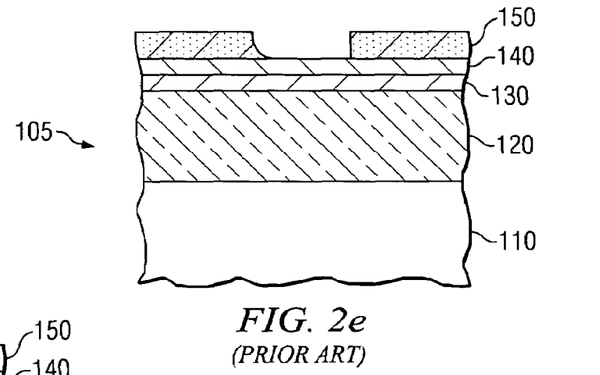
FIG. 2e is a cross-sectional illustration of the mask inspection step in a typical EUV mask manufacturing process.
Figure 2F:
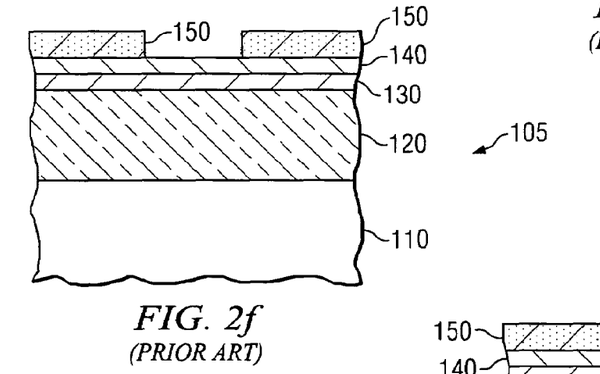
FIG. 2f is a cross-sectional illustration of the mask repair step in a typical EUV mask manufacturing process.
Figure 2G:
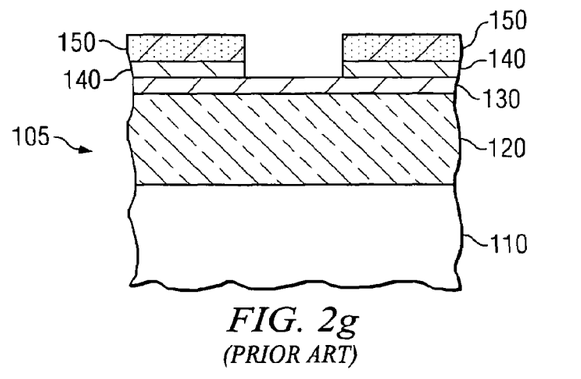
FIG. 2g is a cross-sectional illustration of the buffer etch step in a typical EUV mask manufacturing process.

In the step illustrated in FIG. 2g, the buffer layer is patterned with another etch. The etch process stops either on an optional protective capping layer 130 or on the topmost layer of the Bragg reflector 120.

Figure 2H:
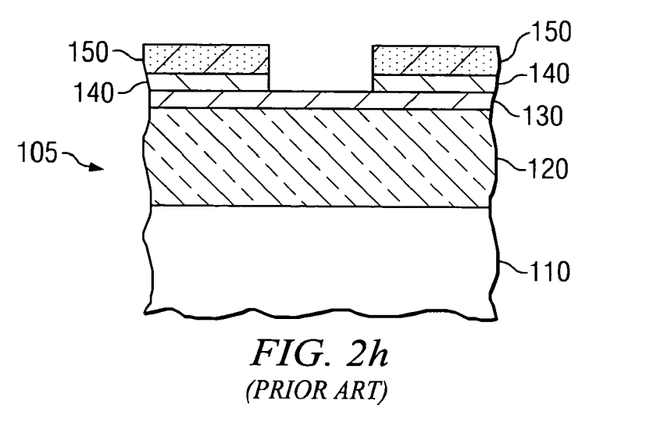
FIG. 2h is a cross-sectional illustration of the mask clean step in a typical EUV mask manufacturing process.

After the buffer layer has been removed from the bright areas, mask patterning is completed. The material exposed in the bright area (capping layer or topmost layer of Bragg reflector) and the sidewalls (absorber and buffer material) have to withstand repetitive mask cleaning, FIG. 2h, without damage to mask.

The requirements with respect to the individual layers in the process steps shown in FIGS. 2a-2h are very difficult to meet simultaneously. The layers must have good etch selectivity for patterning. The mask layers must be thick enough to enable EUV mask repair without damaging the Bragg reflector. On the other hand, thin layers decrease the time needed for removing bright field defects. The mask must be robust enough to tolerate repetitive cleaning, which again favors thick layers. Balancing these competing processing requirements is especially difficult for the buffer layer, especially for inspection. The buffer layer must have a high optical contrast with respect to the absorber material for inspection.

In the past, optical lithography was also concerned with defects in masks. The large expense associated with mask fabrication requires that a mask not be discarded for small defects. Even more importantly, a defective mask often leads to defective devices. For masks used in step and repeat operations, i.e. reticles, a single mask defect can ruin an entire wafer. Generally, the transmissive masks used in optical lithography can be inspected without difficulty since the contrast between the opaque regions and the clear regions is high at most wavelengths. For next generation lithography, such as EUV lithography, inspection is more difficult.

Inspection for defects on the EUV mask is usually done at UV/DUV wavelengths, 150-500 nm. A problem is that contrast between the EUV mask layers is often inadequate. Manufacturers have recognized this problem and have taken steps to improve EUV mask contrast (see U.S. Pat. Nos. 6,720,118 and 6,583,068). However, some of these methods still remain limited to inspection at the UV/DUV wavelengths.

What is needed is an EUV mask that is not constrained by UV/DUV contrast requirements.

SUMMARY OF THE INVENTION

These and other problems are generally solved or circumvented, and technical advantages are generally achieved, by preferred embodiments of the present invention that include a lithography mask having high magnetic contrast between multiple layers. Other preferred embodiments include a method for fabricating a lithography mask, not by selecting materials with respect to high optical contrast for inspection, but with respect to high magnetic contrast. Other preferred embodiments include a method for inspecting a mask after patterning and etching using instruments that can image high magnetic field contrast.

In accordance with a preferred embodiment of the present invention, a lithography mask comprises a substrate, a Bragg reflector on the substrate, a buffer layer on the Bragg reflector, and an absorber layer disposed on the substrate. The materials in the mask have selected magnetic properties. In this preferred embodiment, the buffer is a hard magnetic material, and the absorber is a soft magnetic material.

Generally, a hard magnetic material is one that retains its magnetization for a suitable period after removal of the magnetizing field. Generally, a soft magnetic material is one that rapidly loses its magnetization after removal a magnetizing field. Generally, whether a material is hard or soft is a relative classification, and it is determined to some extent by the degree of magnetization required for a given analysis.

In accordance with another preferred embodiment of the present invention, the buffer is a soft magnetic material, and the absorber is a hard magnetic material.

In yet another preferred embodiment, the mask further comprises an optional capping layer interposed between the Bragg reflector and the buffer layer, wherein the capping layer has selected magnetic properties.

Another preferred embodiment of the present invention includes a method for inspecting EUV masks. The method comprises providing an EUV substrate, forming a Bragg reflector over the substrate, forming a buffer layer over the Bragg layer, and forming an absorber layer over the Bragg layer. The method further comprises selecting the Bragg reflector, the buffer layer, and the absorber layer based on selected magnetic properties and imaging the mask with respect to the magnetic properties.

Another preferred embodiment includes a method for inspecting EUV masks comprising modulating the magnetization of at least one layer in the EUV mask with a magnetic field and imaging the mask with respect to the magnetization.

Yet another preferred embodiment of the method for inspecting EUV masks further comprises an optional capping layer interposed between the Bragg reflector and the buffer layer, wherein the capping layer has selected magnetic properties.

An advantage of preferred embodiments of the present invention is that mask inspection requirements are decoupled from those of other steps in the mask manufacturing process. Mask materials generally do not require high EUV or optical contrast to conform to inspection requirements. Mask inspection will therefore generally not impose a requirement that is incompatible other layer requirements imposed by other process steps such as mask etch or repair.

A further advantage of a preferred embodiment of the present invention is that it may simultaneously meet the requirements for individual layers, specifically for the buffer layer, with respect to aspect ratio, patterning, compatibility with repair techniques and high inspection contrast.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an EUV magnetic contrast mask. The invention may also be applied, however, to other next generation lithography methods such as X-ray or electron beam, for example.

An Electron Mirror Microscope (EMM) is a preferred means for imaging and inspecting an EUV magnetic mask. Inspection after the absorber etch is preferred for it is at this point in mask fabrication that defects are best repaired or particles removed. In an EMM, the specimen is held at a high negative potential so that an incoming beam of high-energy electrons is decelerated and finally reflected just before reaching the specimen. The reflected electrons are then imaged in an electron optical system resembling that of a transmission electron microscope. The EMM is very sensitive to microfields near the specimen and to the step height of objects under study. The lowest step height detectable in the EMM is on the order of 1 nm.

Figure 3:
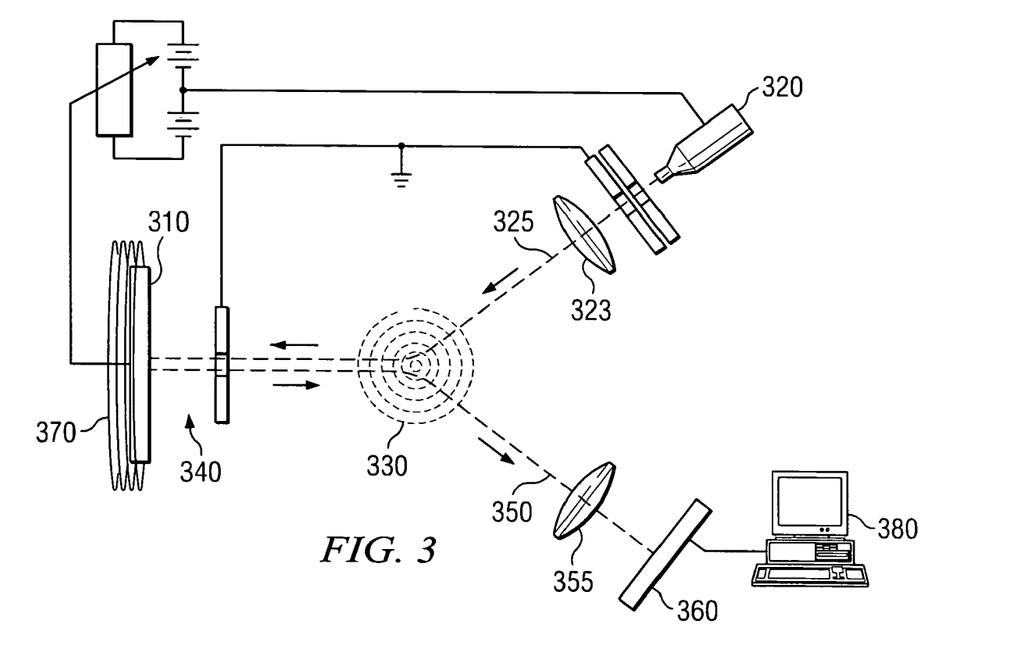
FIG. 3 is a block diagram of a high contrast mask imaging system.

With reference now to FIG. 3, there is a schematic of an apparatus for imaging and inspecting an EUV mask. In preferred embodiments, the apparatus comprises an EMM. The mask 310 is held at a negative potential with respect to the electron source 320, which can include a cathode. The mask 310 acts as an anode electrode at which the electrons are mirrored. Electrons 325 coming from an electron source 320 pass through an electron optic 323 and are then deflected in a magnetic field 330 (the field vector of which is pointing out of the drawing) towards the mask 310, which functions as an electron mirror.

The electrons approaching the object 325 are decelerated by a homogeneous electric field 340 in front of the mask 310. The field 340 decelerates the incoming electrons 325 directly in front of the mask 310 and accelerates them back towards the deflecting magnetic field 330. The combination of the mask 310 and the homogeneous electric field in front of the mask 340 act as an electron mirror thereby reflecting electrons.

The deflecting magnetic field 330 separates source electrons 325 from reflected electrons 350 coming from the mask 310, with the reflected electrons 350 being aimed towards a projection optic 355 and a suitable detector 360 (CCD, fluorescent screen etc.) for displaying a magnified image of the mask.

The apparatus in FIG. 3 further includes a computer 380 for digitizing and storing a magnified image of the mask. The computer 380 comprises software and hardware for comparing the digitized mask image to an as-designed mask. Using statistical sampling techniques along with process control algorithms and hardware well known in the manufacturing arts, the mask inspection apparatus illustrated in FIG. 3 may be a component of a process system (not shown) that automatically detects and repairs mask defects.

As noted above, the EMM is very sensitive to steps in the specimen's surface. When the specimen is held at a high electric potential, surface steps in the specimen translate into surfaces having unequal electrical potential, or non-equipotential surfaces. A uniform electron beam reflected from a non-planar, non-equipotential surface acquires a velocity component tangential to that surface. In this way, the surface topography of the surface registers as intensity variations at the detector.

In a preferred embodiment, a magnetic coil 370 is integrated into the EMM near the mask 310. By adjusting the relative orientations of the mask 310 and the magnetic coil 370, it is possible to adjust the magnetization (dark or bright field areas) relative to a mask feature orientation. For example, mounting the mask 310 on a stage (not shown) enables rotation of a mask pattern and its magnetization. In this way, the magnetic orientations of layers are adjusted for optimum imaging of a defect or other mask feature.

For example, rotating the mask is one preferred means to image a soft magnetic patterned layer on an underlying hard magnetic layer. If several such images are taken at different magnetic field orientations then it is possible to isolate defects with a magnetization different for that of dark or bright field areas. This is also true for particles. If the soft-magnetic layer is demagnetized, for example, only the geometric structure of the mask will be imaged. The magnet's coil current as well as the coil geometry are other parameters that can be adjusted in order to optimize imaging conditions.

Yet another preferred embodiment includes using suitable magnetic materials in the EUV mask in combination with spin polarization sensitive electro-optic imaging devices, such as the EMM. Such a combination may achieve higher resolution than optical methods.

Figure 4A:
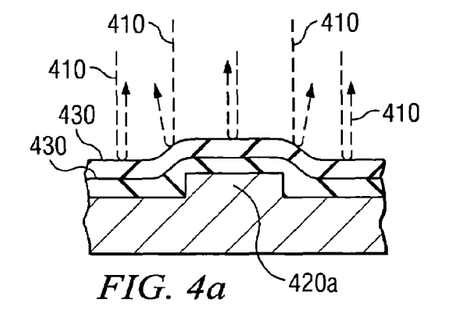
FIG. 4a is a cross-sectional illustration of an electron beam reflected from a surface having a step.
Figure 4B:
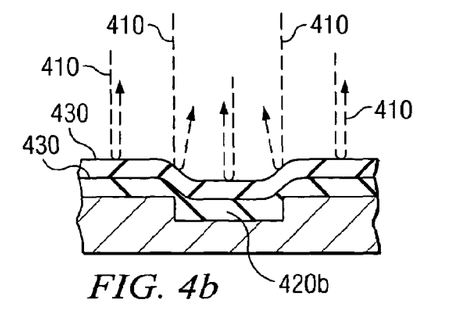
FIG. 4b is a cross-sectional illustration of an electron beam reflected from a surface having a trench.

FIGS. 4a,b,c show examples of reflection of a normal, incident, mono-energetic (or monochromatic) electron beam 410 at non-equipotential surfaces 420(a,b,c) of an object. As schematically shown in this figure, changes in surface potential contours 430 cause tangential deflection and acceleration of the reflected electrons and therefore enable imaging onto the detector shown in FIG. 3. Surface topography is one factor that affects surface potential. For example, a step 420a or a trench 420b deflects incident electrons 410. Other factors include the specimen's electrical and magnetic properties.

Figure 4C:
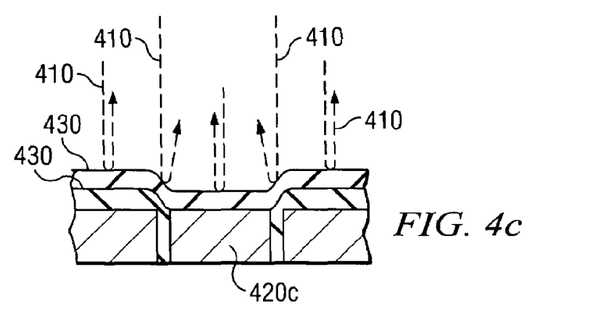
FIG. 4c is a cross-sectional illustration of an electron beam reflected from a flat, magnetic surface.

For example, in accordance with preferred embodiments, the magnetic orientation of the object can be changed with an applied magnetic field. If a portion 420c of the specimen includes a soft magnetic material, addition of a magnetic field will affect the EMM image since the magnetic orientation of the specimen will contribute to the scatter of the electron beam. By way of another example, if two materials differ with respect to their interaction with the electron spins of the approaching electrons, this will also lead to a respective intensity variation in the detector plane. In addition to imaging of surface topography, the EMM permits imaging of the specimen's electrical and magnetic variations since these change the imaging electron beam as well.

In preferred embodiments, the photomask includes magnetic materials. When the mask absorber or buffer, for example, has magnetic properties, the properties act cooperatively with the surface topography of the mask to scatter the imaging electron beam thereby further enhance image contrast. In preferred embodiments, the mask includes either hard or soft magnetic materials. For example, if an EUV absorber/buffer layer combination with a high magnetic contrast is selected, then the inspection step 250 in FIG. 2 can be done using an EMM as sketched in FIG. 3 and the optical contrast requirement for absorber/buffer layer can be dropped in favor of the magnetic contrast requirement. This allows optimizing the buffer layer with respect to the other requirements (etch, repair) without having to simultaneously meet the often mutually exclusive optical inspection requirements.

As stated above, generally, a hard magnetic material retains its magnetization after removal of the magnetizing field, and a soft magnetic material rapidly loses its magnetization. The differentiating parameter is the material's coercivity. Coercivity, which has units A/cm, is the external magnetic field required to reverse the magnetization of a material to zero. Materials with a coercivity greater than approximately 10 A/cm are generally considered hard magnetic materials, while those with a coercivity less than this are generally considered soft magnetic materials. By way of example, soft magnetic materials include: Fe, Ni, Co, Gd, Dy, Mn, MnBi, FeSi. Soft magnetic materials may also include the following alloys: FeCo, FeAl, and FeNi. In the case of FeNi, the alloy should contain no less than approximately 20% Ni, with approximately 80% Ni preferred. Hard magnetic materials can include CoFeNi, FeCoCr, FeCoV, FeCrCo, AlNiCo, CuNiFe, MnAlCo, PtCo, NdFeCo, for example.

Figure 5A:
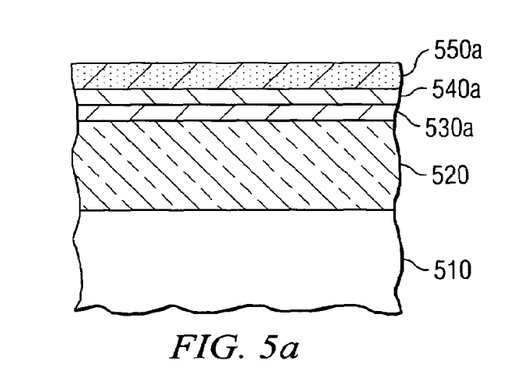
FIG. 5a is a cross-sectional illustration of an EUV mask comprising a soft magnetic capping layer, a soft magnetic buffer layer, and a hard magnetic absorber layer.

FIG. 5a shows a preferred embodiment of an EUV mask. The mask comprises a substrate 510 and an EUV Bragg reflector 520. In preferred embodiments, the Bragg reflector may include alternating layers (not shown) of a high Z material, about 2.8 nm thick Mo, and a low Z material, about 4.1 nm thick Si, for example.

The preferred embodiment in FIG. 5a further comprises an optional capping layer 530a comprising a soft magnetic material, a buffer layer 540a comprising a soft magnetic material, and an EUV absorber layer 550a comprising a hard magnetic material. The magnetic properties of the capping layer 530a are chosen such that a high magnetic inspection contrast is maintained with respect to the absorber layer 550a after removing the buffer layer 540a. The magnetic orientation of the soft magnetic layers (i.e. the optional capping layer 530a and the buffer layer 540a) can be adjusted using an external field to maximize the magnetic contrast between the buffer 540a and absorber layer 550a.

Figure 5B:
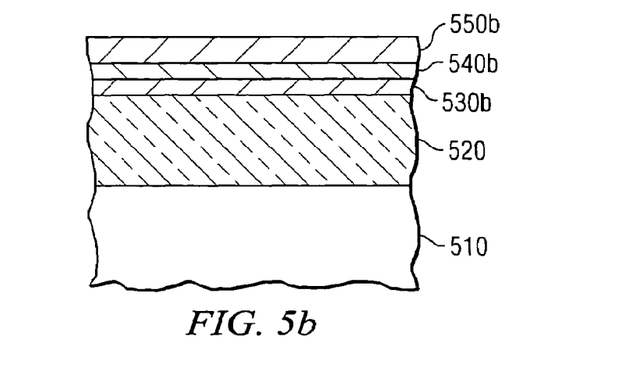
FIG. 5b is a cross-sectional illustration of an EUV mask comprising a hard magnetic capping layer, a hard magnetic buffer layer, and a soft magnetic absorber layer.

FIG. 5b shows an alternative preferred embodiment of an EUV mask. The mask comprises a substrate 510, an EUV Bragg reflector 520, an optional capping layer 530b comprising a hard magnetic material, a buffer layer 540b comprising a hard magnetic material, and an EUV absorber layer 550b comprising a soft magnetic material. In this preferred embodiment, the magnetic orientation of the soft magnetic absorber layer 550b is adjusted with an external magnetic field in order to achieve optimum imaging contrast. Other embodiments can include various combinations of magnetic and non-magnetic materials for absorber, buffer, and the optional capping layer.

Although the present invention and its advantages have been described in detail, it should be understood that various changes, substitutions and alterations can be made herein without departing from the spirit and scope of the invention as defined by the appended claims. For example, many of the features and functions of the EMM system discussed above can be implemented in software, hardware, or firmware, or a combination thereof. As another example, it will be readily understood by those skilled in the art that the microscope, EUV mask materials, or other elements may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lithography mask comprising:
   a substrate;
   a Bragg reflector disposed over the substrate;
   a buffer layer disposed over the Bragg reflector; and
   an absorber layer disposed over the buffer layer, wherein at least one of the Bragg reflector, the buffer layer, the absorber layer, and the capping layer is a magnetic material to increase inspection contrast and wherein the Bragg reflector, the buffer layer, the absorber layer, and the capping layer have first, second, third, and fourth selected magnetic properties, respectively.

2. The lithography mask of claim 1, wherein the magnetic material is a hard magnetic material.

3. The lithography mask of claim 2, wherein the hard magnetic material is selected from the group consisting of CoFeNi, FeCoCr, FeCoV, FeCrCo, AlNiCo, CuNiFe, MnAlCo, PtCo, NdFeCo, and combinations thereof.

4. The lithography mask of claim 1, wherein the magnetic material is a soft magnetic material.

5. The lithography mask of claim 4, wherein the soft magnetic material is selected from the group consisting of Fe, Ni, Co, Gd, Dy, Mn, MnBi, FeSi, and combinations thereof.

6. The lithography mask of claim 4, wherein the soft magnetic material is an alloy selected from the group consisting of FeNi, FeCo, FeAl, and combinations thereof.

7. The lithography mask as in claim 6 wherein the FeNi alloy contains no less than 20% Ni.

8. A lithography mask comprising:
   a substrate;
   a Bragg reflector having first selected magnetic properties disposed upon the substrate;
   a buffer layer having second selected magnetic properties disposed upon the Bragg reflector; and
   an absorber layer having third selected magnetic properties disposed upon the buffer layer.

9. The lithography mask of claim 8, wherein a capping layer having fourth selected magnetic properties is interposed between the Bragg reflector and the buffer layer.

10. The lithography mask of claim 9, wherein the selected magnetic properties of least one of the Bragg reflector, the buffer layer, the absorber layer, and the capping layer increases inspection contrast.

11. The lithography mask of claim 9, wherein the selected magnetic properties of at least one of the Bragg reflector, the buffer layer, the absorber layer, and the capping layer increases inspection contrast for electron microscopy.

12. The lithography mask of claim 9, wherein the selected magnetic properties of least one of the Bragg reflector, the buffer layer, the absorber layer, and the capping layer is a soft magnetic material.

13. The lithography mask as in claim 12, wherein the soft magnetic material is selected from the group consisting of Fe, Ni, Co, Gd, Dy, Mn, MnBi, FeSi, and combinations thereof.

14. The lithography mask as in claim 12, wherein the soft magnetic material is an alloy selected from the group consisting of FeNi, FeCo, FeAl, and combinations thereof.

15. The lithography mask as in claim 14, wherein the FeNi alloy contains no less than 20% Ni.

16. The lithography mask of claim 9, wherein the selected magnetic properties of least one of the Bragg reflector, the buffer layer, the absorber layer, and the capping layer is a hard magnetic material.

17. The lithography mask as in claim 16, wherein the hard magnetic material is selected from the group consisting of CoFeNi, FeCoCr, FeCoV, FeCrCo, AlNiCo, CuNiFe, MnAlCo, PtCo, NdFeCo, and combinations thereof.

18. The lithography mask of claim 9, wherein the capping layer is a soft magnetic material, the buffer layer is a soft magnetic material, and the absorber is a hard magnetic material.

19. The lithography mask of claim 9, wherein the capping layer is a hard magnetic material, the buffer layer is a hard magnetic material, and the absorber is a soft magnetic material.

20. The lithography mask of claim 9, wherein the buffer layer is a soft magnetic material and the absorber is a hard magnetic material.

21. The lithography mask of claim 9, wherein the buffer layer is a hard magnetic material and the absorber is a soft magnetic material.

22. The lithography mask of claim 9, wherein the Bragg reflector is a hard magnetic material.

23. The lithography mask of claim 9, wherein the Bragg reflector is a soft magnetic material.

24. A method of manufacturing a semiconductor device comprising patterning a semiconductor wafer by use of the lithography mask according to claim 8.

25. A method of making a lithography mask, the method comprising:
   forming a Bragg reflector having first selected magnetic properties on a substrate;
   forming an absorber layer having second selected magnetic properties on the Bragg reflector;
   applying a magnetic field to the mask;
   imaging the mask with respect to the magnetic properties and the applied magnetic field; and
   repairing a mask defect using the imaging.

26. The method of claim 25 further comprising imaging the mask with an electron microscope.

* * * * *

UNITED STATES PATENT AND TRADEMARK OFFICE
CERTIFICATE OF CORRECTION

PATENT NO. : 7,407,729 B2
APPLICATION NO. : 10/912658
DATED : August 5, 2008
INVENTOR(S) : Schwarzl et al.

It is certified that error appears in the above-identified patent and that said Letters Patent is hereby corrected as shown below:

In Col. 9, line 13, before least insert --at--.
In Col. 9, line 21, before least insert --at--.
In Col. 9, line 33, before least insert --at--.

Signed and Sealed this

Ninth Day of December, 2008

JON W. DUDAS
*Director of the United States Patent and Trademark Office*